US009318603B2

(12) United States Patent
Su et al.

(10) Patent No.: US 9,318,603 B2
(45) Date of Patent: Apr. 19, 2016

(54) METHOD OF MAKING A LOW-RDSON VERTICAL POWER MOSFET DEVICE

(71) Applicant: Alpha and Omega Semiconductor Incorporated, Sunnyvale, CA (US)

(72) Inventors: Yi Su, Cupertino, CA (US); Daniel Ng, Campbell, CA (US); Anup Bhalla, Santa Clara, CA (US); Jun Lu, San Jose, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 130 days.

(21) Appl. No.: 14/201,850

(22) Filed: Mar. 8, 2014

(65) Prior Publication Data
US 2014/0225185 A1     Aug. 14, 2014

Related U.S. Application Data

(62) Division of application No. 13/216,122, filed on Aug. 23, 2011, now Pat. No. 8,709,893.

(51) Int. Cl.
| H01L 21/00 | (2006.01) |
| H01L 29/78 | (2006.01) |
| H01L 29/417 | (2006.01) |
| H01L 29/66 | (2006.01) |

(Continued)

(52) U.S. Cl.
CPC ...... *H01L 29/7827* (2013.01); *H01L 21/30604* (2013.01); *H01L 21/30608* (2013.01); *H01L 23/495* (2013.01); *H01L 23/49503* (2013.01); *H01L 23/49513* (2013.01); *H01L 23/49562* (2013.01); *H01L 24/83* (2013.01); *H01L 29/0657* (2013.01); *H01L 29/41741* (2013.01); *H01L 29/41766* (2013.01); *H01L 29/66666* (2013.01); *H01L 29/66727* (2013.01); *H01L 29/66734* (2013.01); *H01L 29/7802* (2013.01); *H01L 29/7811* (2013.01); *H01L 29/7813* (2013.01); *H01L 24/29* (2013.01); *H01L 29/0619* (2013.01); *H01L 29/0638* (2013.01); *H01L 29/456* (2013.01); *H01L 2224/291* (2013.01); *H01L 2224/293* (2013.01); *H01L 2224/2929* (2013.01); *H01L 2224/32245* (2013.01); *H01L 2224/8309* (2013.01); *H01L 2224/83141* (2013.01); *H01L 2224/83365* (2013.01); *H01L 2224/83385* (2013.01); *H01L 2224/83801* (2013.01); *H01L 2224/83851* (2013.01); *H01L 2924/12036* (2013.01); *H01L 2924/12042* (2013.01); *H01L 2924/13091* (2013.01)

(58) Field of Classification Search
CPC ............ H01L 29/7827; H01L 29/7002; H01L 29/7811
See application file for complete search history.

(56) References Cited

U.S. PATENT DOCUMENTS

| 4,849,800 A | 7/1989 | Abbas et al. | |
| 5,804,462 A * | 9/1998 | Liu | G01N 33/0031 |
| | | | 438/53 |

(Continued)

*Primary Examiner* — Laura Menz

(57) ABSTRACT

The invention relates to a power semiconductor device and its preparation methods thereof. Particularly, the invention aims at providing a method for reducing substrate contribution to the Rdson (drain-source on resistance) of power MOSFETs, and a power MOSFET device made by the method. By forming one or more bottom grooves at the bottom of Si substrate, the on resistance of the power MOSFET device attributed to the substrate is effectively reduced. A matching lead frame base complementary to the substrate with bottom grooves further improves the package of the power MOSFET device.

5 Claims, 12 Drawing Sheets

(51) Int. Cl.
  *H01L 23/495* (2006.01)
  *H01L 21/306* (2006.01)
  *H01L 29/45* (2006.01)
  *H01L 29/06* (2006.01)
  *H01L 23/00* (2006.01)

(56) References Cited

U.S. PATENT DOCUMENTS

| | | | | |
|---|---|---|---|---|
| 6,069,392 A * | 5/2000 | Tai | ............ | B81B 3/007 257/415 |
| 6,240,777 B1 * | 6/2001 | Treutler | ............ | G01F 1/6845 73/204.11 |
| 6,538,328 B1 * | 3/2003 | Munch | ............ | B81C 1/00801 257/664 |
| 6,565,765 B1 * | 5/2003 | Weber | ............ | B81C 1/00158 216/83 |
| 6,648,503 B2 * | 11/2003 | Tanaka | ............ | G01J 5/20 250/338.1 |
| 6,660,592 B2 | 12/2003 | Chuang et al. | | |
| 6,701,782 B2 * | 3/2004 | Iwaki | ............ | G01F 1/692 73/204.26 |
| 6,703,684 B2 * | 3/2004 | Udrea | ............ | H01L 21/764 257/487 |
| 6,984,871 B2 * | 1/2006 | Tanoue | ............ | H01L 29/0657 257/573 |
| 7,104,113 B2 * | 9/2006 | Zribi | ............ | B82Y 15/00 73/25.05 |
| 7,282,753 B2 * | 10/2007 | Kub | ............ | H01L 29/0657 257/288 |
| 8,709,893 B2 * | 4/2014 | Su | ............ | H01L 29/41741 438/140 |
| 2013/0049100 A1 * | 2/2013 | Su | ............ | H01L 29/41741 257/329 |
| 2014/0225185 A1 * | 8/2014 | Su | ............ | H01L 29/41741 257/329 |

* cited by examiner

US 9,318,603 B2

METHOD OF MAKING A LOW-RDSON VERTICAL POWER MOSFET DEVICE

CROSS REFERENCE TO RELATED APPLICATIONS

This application is a divisional application of a pending U.S. patent application entitled "METHOD OF MAKING A LOW-RDSON VERTICAL POWER MOSFET DEVICE" application Ser. No. 13/216,122, filing date: Aug. 23, 2011, inventor Yi Su. The above contents are incorporated herein by reference for any and all purposes.

TECHNICAL FIELD

The invention relates to a power semiconductor device and its preparation methods thereof. Particularly, the invention aims at providing a method for reducing substrate contribution to the Rdson (drain-source on resistance) of power MOSFETs, and a power MOSFET device made by the method.

BACKGROUND TECHNOLOGY

For power transistors, large Rdson cause larger power consumption. It is desirable to reduce the Rdson as much as possible to reduce device power consumption. The Rdson of a transistor usually can be simulated and calculated. For a 30V trench gate MOSFET with 0.8 micron pitch, the total Rdson in a square millimeter under a 10V is typically around 4.1 milliohm, while the Rdson of the silicon substrate is about 2 milliohm, which contributes almost 49% of the total Rdson; and the total Rdson in a square millimeter under a 4.5V is 5.7 milliohm, while the Rdson of the silicon substrate is 2 milliohm approximately, which contributes almost 35% of the total Rdson. Thus, reducing the silicon substrate can improve Rdson in the power device.

A plurality of etching methods of standard techniques can be used for etching the silicon substrate. Besides, electric-chemical etching method can also be used to etch the silicon substrate. The main principle of the electric-chemical etching method is to use a PN junction generated at the interface of an N-type semiconductor slab and a P-type semiconductor slab to implement electric-chemical etching on a semiconductor slab that needs to be etched under a reverse biased condition. As shown in the FIG. 1, the N-type semiconductor base plate and the P-type semiconductor base plate combined together are dipped into an etchant. The P-type semiconductor base plate, which needs to be etched, is exposed to the etchant. Then the N-type semiconductor base plate is communicated with an anode, while a cathode is arranged in the etchant. A reference electrode is also arranged in the etchant for reference. During the etching process, the etching stops when the wet etching arrives at the PN junction. The etching conditions can be monitored by measuring current $I_{CE}$.

U.S. Pat. No. 6,111,280 discloses a gas sensor including at least one sensing area provided with a gas-sensitive layer, a MOSFET heater for heating the gas-sensitive layer to promote gas reaction with the gas-sensitive layer, and a sensor for providing an electrical output indicative of gas reaction with the gas-sensitive layer. The silicon substrate of the device in the sensing area is back-etched so as to form a thin membrane in the sensing area, which improves the gas detection sensitivity of the gas sensor.

U.S. Pat. No. 4,618,397 discloses a pressure sensor including diffused resistors formed in a front surface of a semiconductor crystal body, a rear surface of which is thereafter etched partly so as to put a part of the body into a membrane portion, which improves the pressure sensitivity of the pressure sensor.

U.S. Pat. No. 6,927,102 discloses a lateral power MOSFET device having an active region that includes a drift region with a portion of the semiconductor substrate below a portion of the drift region has been removed, which transversely reduces a parasitic capacitance of the power MOSFET. However, the resistances of the device are not reduced.

BRIEF DESCRIPTION OF DRAWINGS

The figures attached can be referred to describe the embodiment of the invention more sufficiently. However, the figures attached are only used for the purpose of explanations and descriptions, but not for limitations to the scope of the invention.

DETAILED DESCRIPTION OF THE DRAWINGS

Embodiment I

Figure 1:
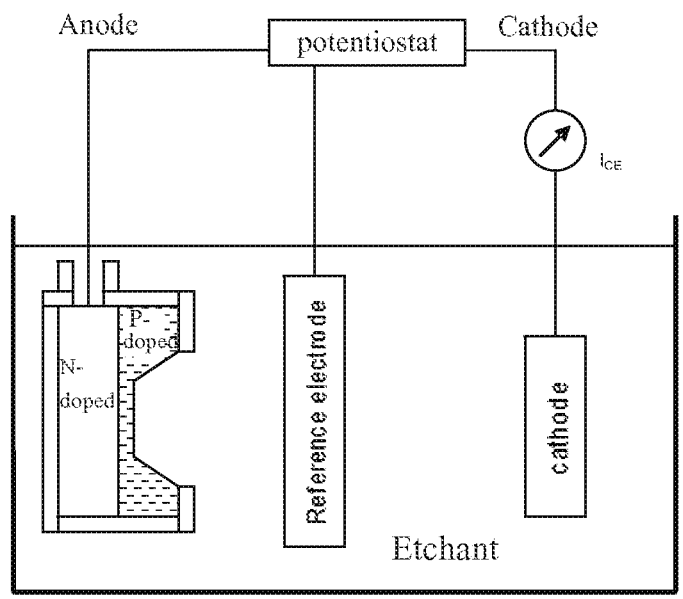
FIG. 1 is a schematic diagram of using electric-chemical etching method to etch silicon slab.
Figure 2A:
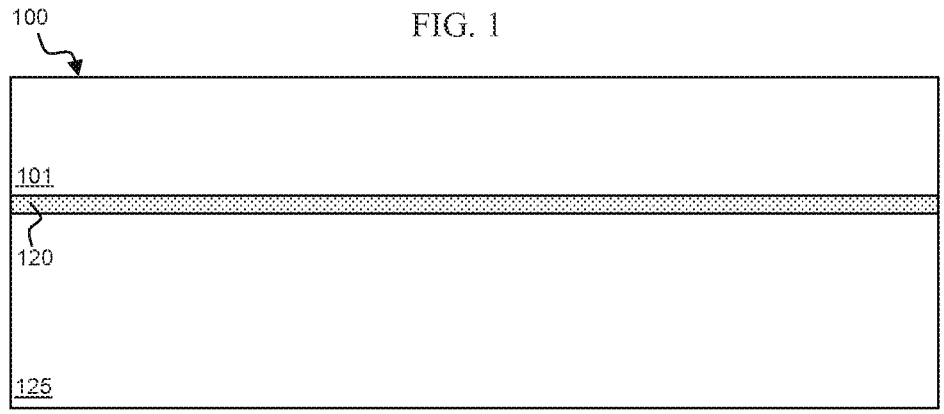
FIG. 2A is a schematic diagram of arranging an etching barrier layer between a substrate and an epitaxial layer.
Figure 2B:
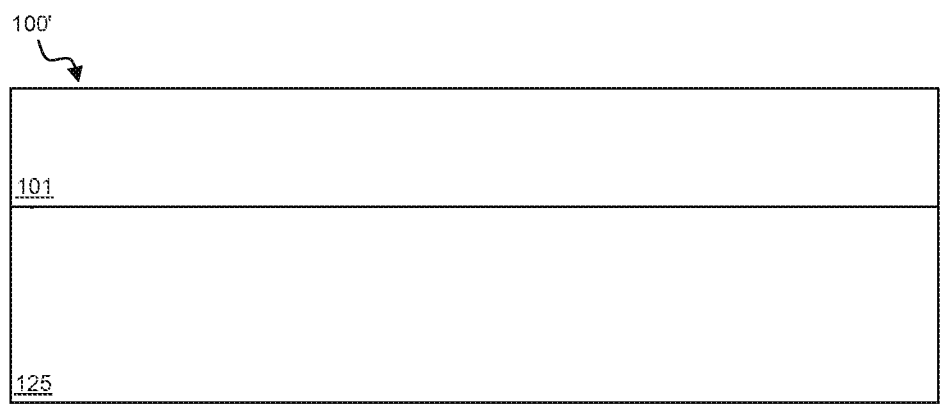
FIG. 2B is a schematic diagram of directly growing an epitaxial layer on a substrate.
Figure 2C:
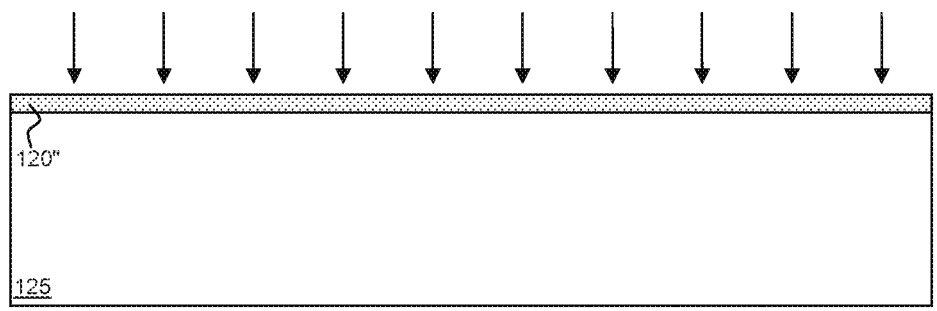
FIG. 2C and FIG. 2D are schematic diagrams of using dopants implantation to form a heavily doped buried layer between a substrate and an epitaxial layer, and use the buried layer as an etching barrier layer.
Figure 2D:
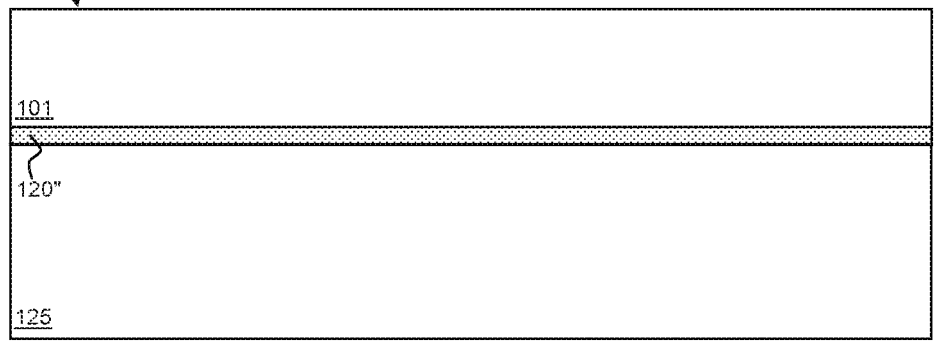

As shown in FIG. 2A, an etching barrier layer 120 is arranged between a substrate 125 and an epitaxial layer 101 in a wafer 100, which is usually called a SOI (silicon on insulator) wafer. However, the epitaxial layer 101 is directly grown on the substrate 125 in wafer 100' as shown in FIG. 2B. Dopants may be implanted on the top surface of the substrate 125 first to form a buried heavily doped layer 120" in wafer 100" as shown in FIG. 2C and FIG. 2D, for example, a P+ buried heavily doped layer 120" maybe implanted at the top surface of lightly doped P− substrate 125, then a lightly doped P− epitaxial layer 101 is grown on the substrate 125. Thus, the buried heavily doped layer 120" is formed between the substrate 125 and the epitaxial layer 101.

Figure 3A:
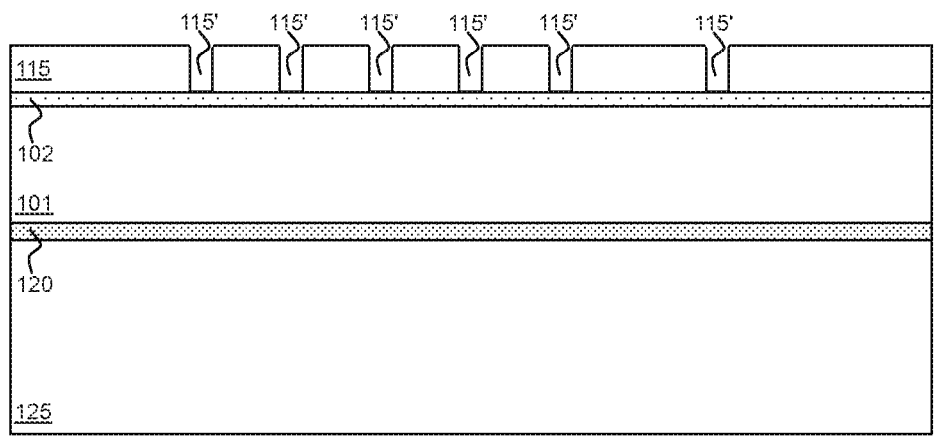
FIGS. 3A-3S are flow charts of method for making power device in the epitaxial layer and forming bottom grooves in the substrate.
Figure 3B:
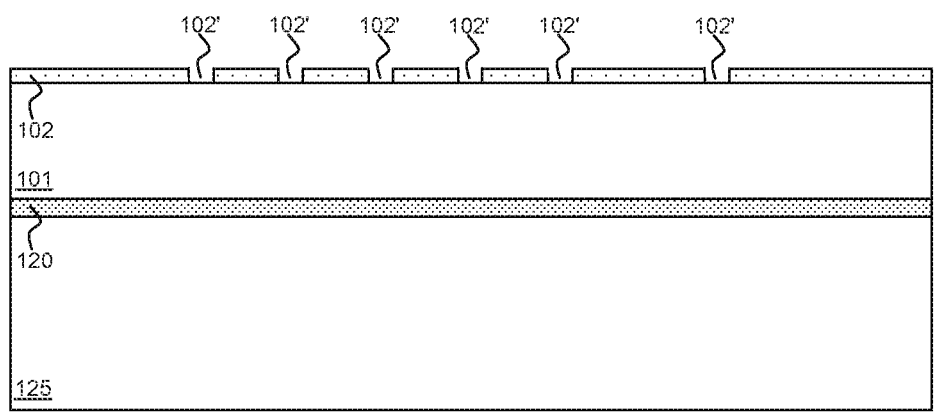
Figure 3C:
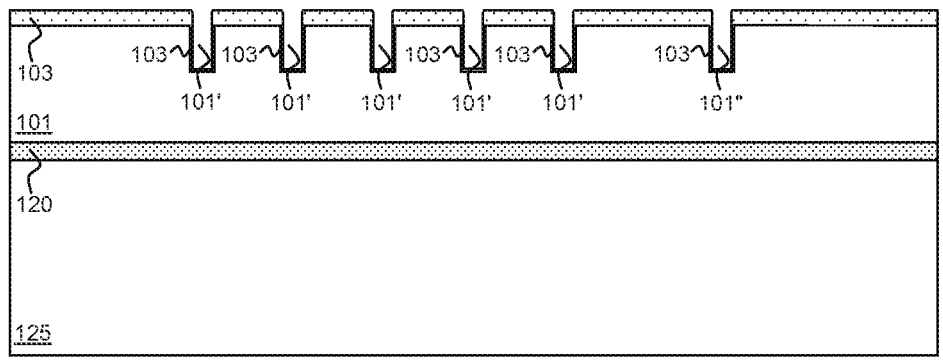
Figure 3D:
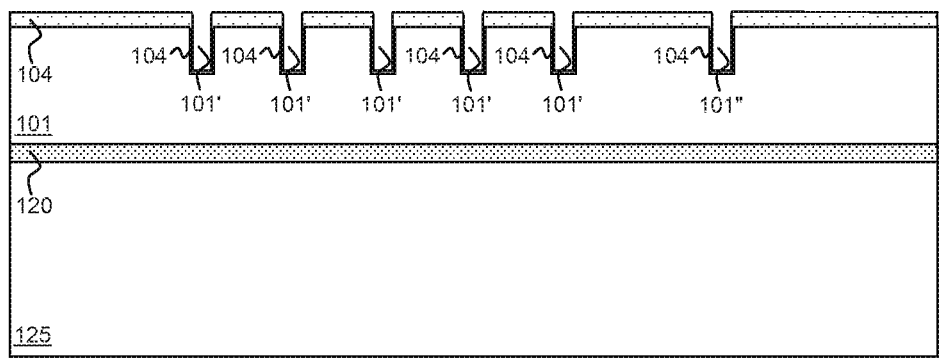
Figure 3E:
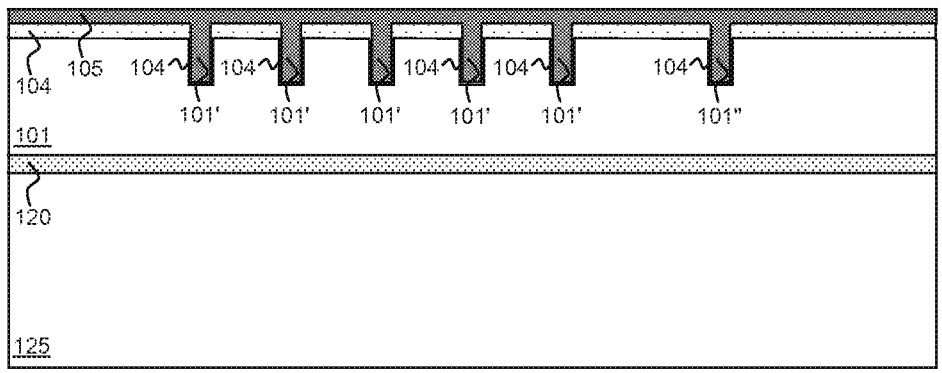
Figure 3F:
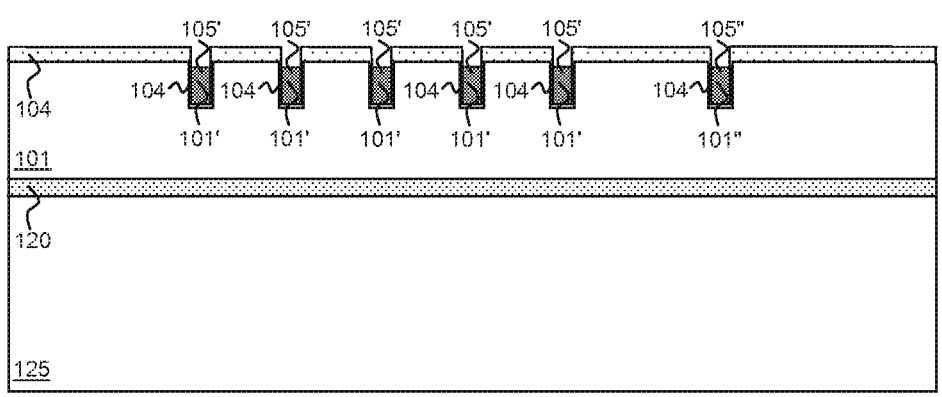
Figure 3G:
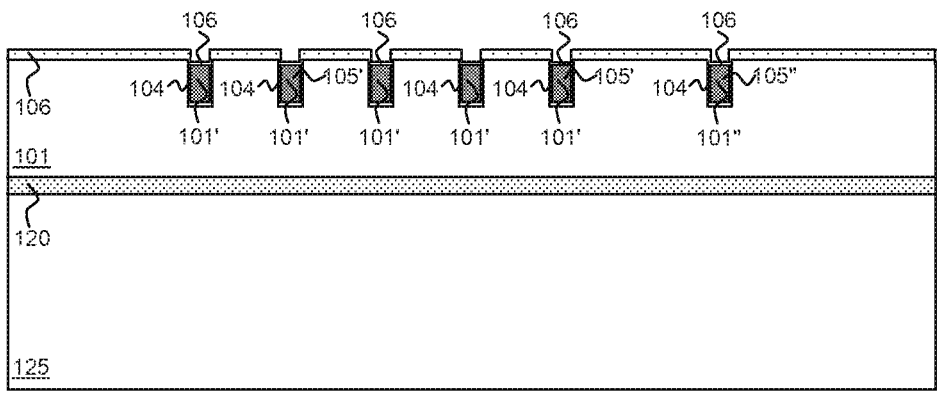
Figure 3H:
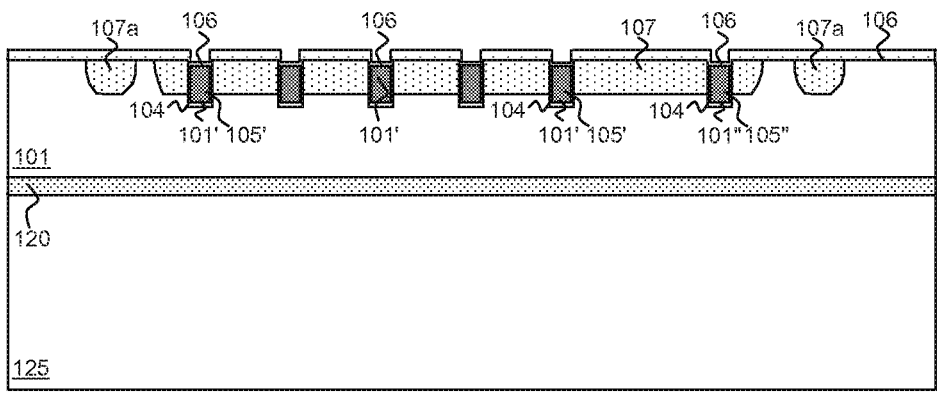
Figure 3I:
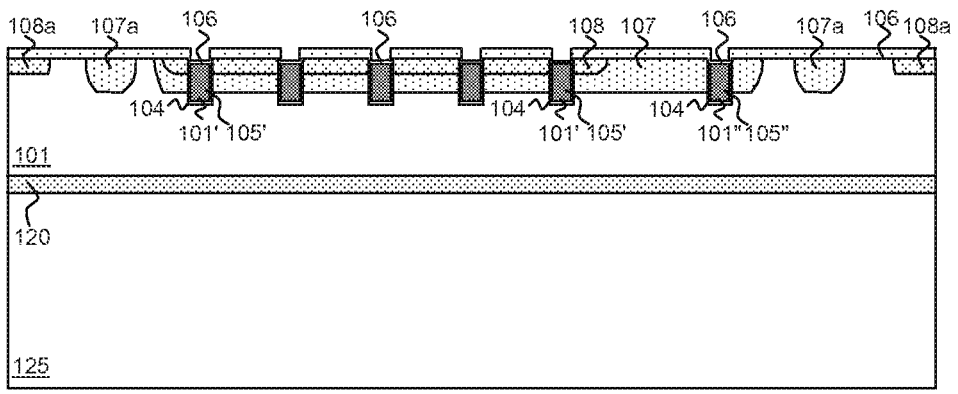

In FIG. 3A, an oxide layer 102 (such as a LTO-low temperature oxide) is formed covering on epitaxial layer 101, then a photoresist layer 115, which is patterned with a plurality of openings 115', is coated on the oxide layer 102. A plurality of openings 102' are formed in the oxide layer 102 by an photo etching technique to etch the oxide layer 102 through the openings 115' as shown in FIG. 3B. The oxide layer 102 is used as a hard mask to etch the epitaxial layer 101 to form a plurality of first type trenches 101' and at least a second type trench 101" in the epitaxial layer 101 as shown in FIG. 3C. In order to obtain smoother trench bottoms to improve the electrical properties, usually anisotropic etching is implemented first, and then followed by a partial isotropic dry etching. The oxide layer 102 is removed as shown in the FIG. 3C. Due to physical damage on the trench sidewalls caused during the dry etching process of forming the trenches and a plurality of other types of surface defects, a layer of defective silicon on the surface of the trench sidewalls is needed to be removed. A wet or dry oxygen thermal oxidation technique with fast speed and small thermal budget is used to grow a sacrifice oxidation layer 103 that covers on the top surface of the epitaxial layer 101 and also covers on the sidewalls and the bottom surfaces of the first type trenches 101' and the second type trench 101", as shown in FIG. 3C, followed by an etching to remove the sacrifice oxidation layer 103. As shown in the FIG. 3D, gate oxide technique under a high temperature oxidation condition is implemented to grow a gate oxide layer 104 that covers on the sidewalls and the bottom surfaces of the first type trenches 101' and the second type trench 101", and also covers on the top surface of the epitaxial layer 101. As shown in the FIGS. 3E-3F, an LPCVD polysilicon layer 105 is deposited overlaying the gate oxide layer 104. During this deposition, the first type trenches 101' and the second type trench 101" defined by the gate oxide layer 104 are all filled with the polysilicon layer 105. In situ doping process or other proper doping process can be selected for the polysilicon layer 105 after deposition. The polysilicon layer 105 is then etched back such that only gate polysilicon 105' and gate runner polysilicon 105" respectively in the first type trenches 101' and the second type trench 101" remain. Actually, the first type trenches 101' and the second type trench 101" are interconnected in a third dimension; therefore, the gate polysilicon 105' and the gate runner polysilicon 105" are also electrically communicated. As shown in the FIG. 3G, after the gate oxide layer 104 covered on the top surface of the epitaxial layer 101 is etched, a shielding oxidation layer 106 is formed on the top surface of the epitaxial layer 101, the gate polysilicon 105' and the gate runner polysilicon 105". As shown in the FIG. 3H, first conductive type dopants are implanted in the surrounding region of the sidewalls of the first type trenches 101' followed with the diffusion annealing. Thus, a body region 107 (the junction depth is usually about 0.6 micron) extending downwards from the top surface of the epitaxial layer 101 into the epitaxial layer 101 is formed. The same ion implantation mask is used to form a guard ring doping region 107a of the first conductive type dopants, which is the same with the doping type of the body region 107, surrounding the body region 107 in the epitaxial layer 101 and separated from the body region 107. As shown in the FIG. 3I, second conductive type dopants (opposite to the first conductive type doping) are implanted in the body region 107 surrounding the sidewalls of the upper parts of the first type trenches 101', thereby forming a top electrode doping region 108 (the junction depth is usually about 0.25 micron) extends downwards from the top surface of the body region 107 into the body region 107. The first type trenches 101' penetrate from the top electrode doping region 108 and the body region 107 and extend into the region of the epitaxial layer 101 below the body region 107. The same ion implantation mask and process used for the top electrode doping region 108 also forms a channel stop doping region 108a of the second type conductive dopants encircled the guard ring doping region 107a in the epitaxial layer 101. The doping type of the channel stop doping region 108a is the same as the doping type of the top electrode doping region 108, and the channel stop doping region 108a is separated from the guard ring doping region 107a.

Figure 3J:
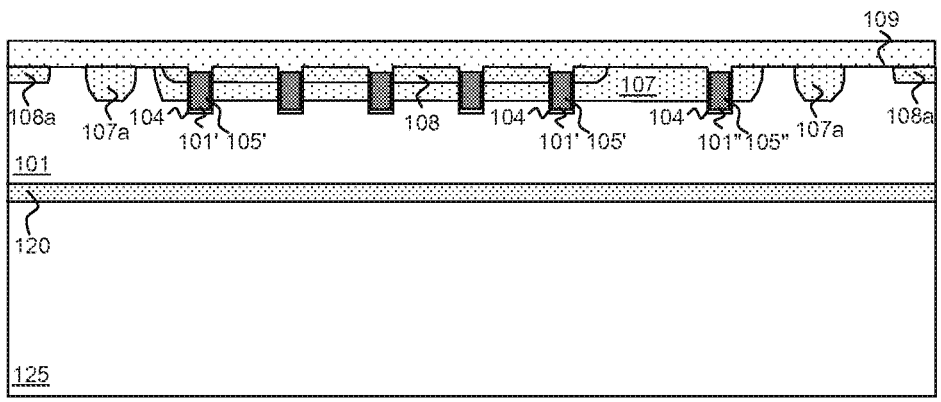
Figure 3K:
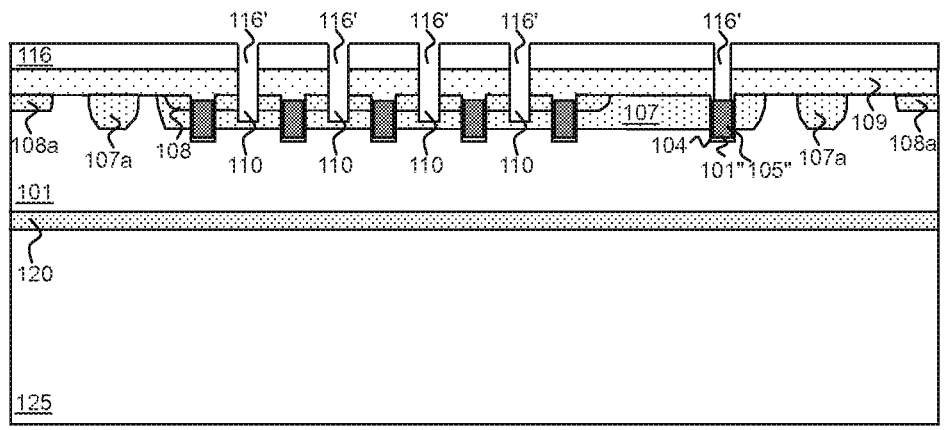
Figure 3L:
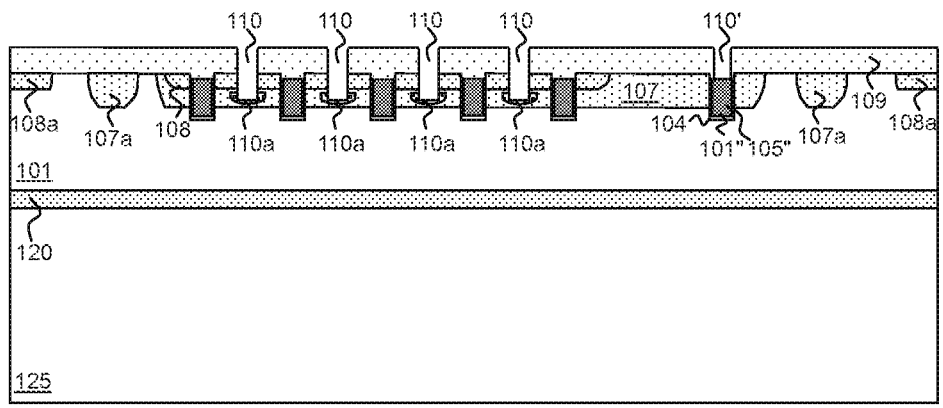
Figure 3M:
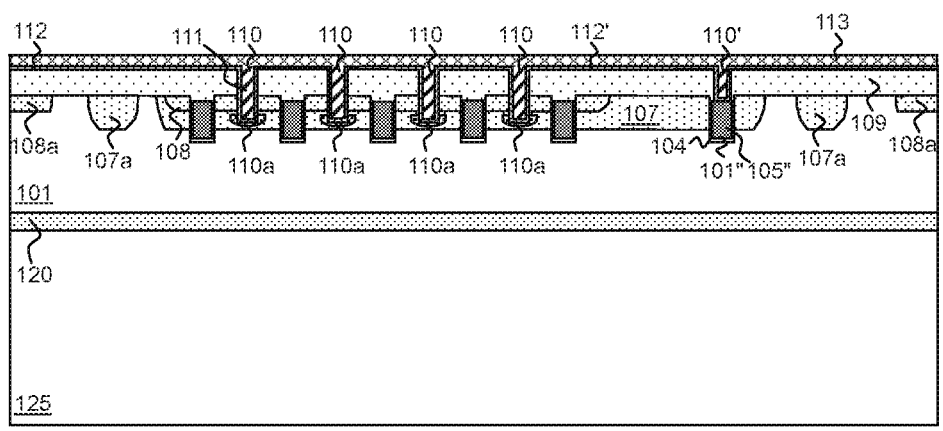
Figure 3N:
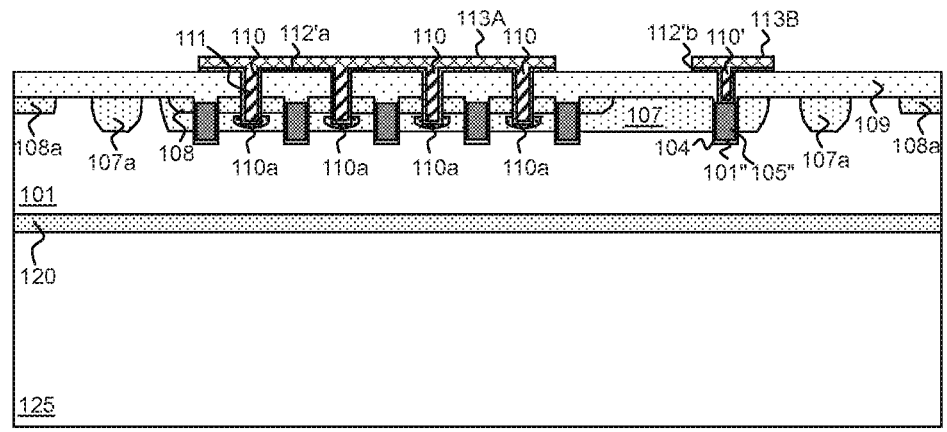
Figure 3O:
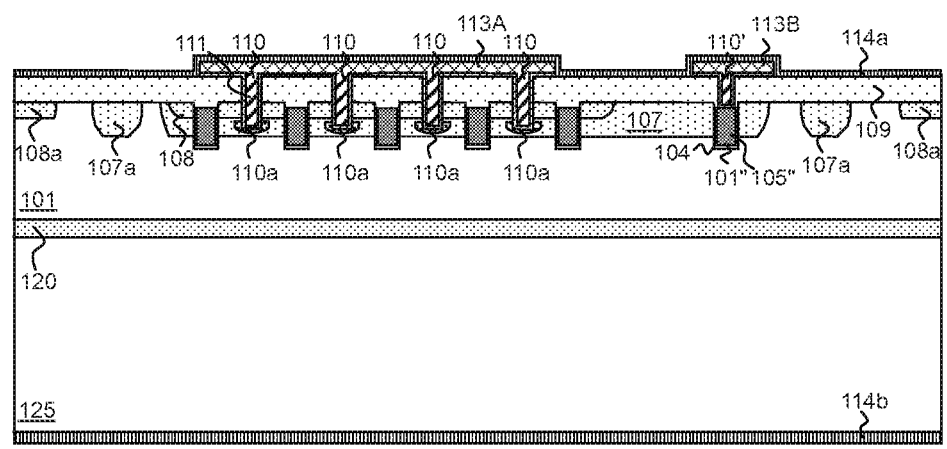
Figure 3P:
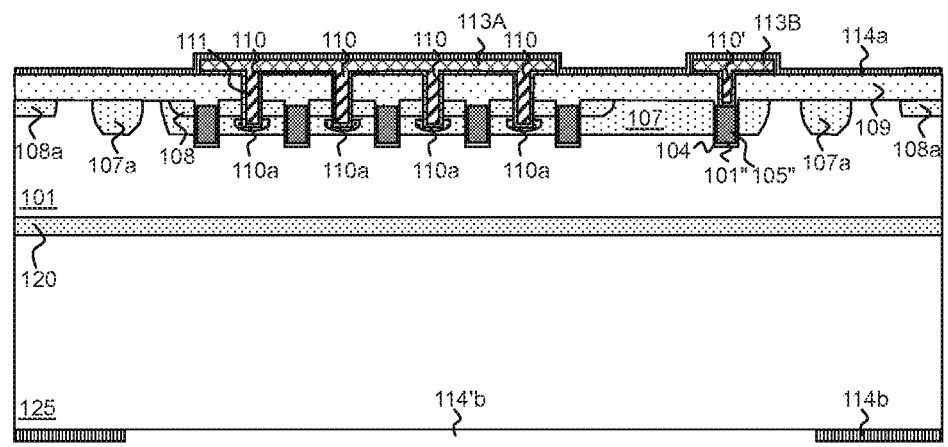

As shown in the FIG. 3J, an insulation layer 109 is deposited on the epitaxial layer, which usually is formed by a double layer of LTO/BPSG, and covers the body region 107, the guard ring doping region 107a, the top electrode doping region 108, the channel stop doping region 108a, as well as the gate polysilicon 105' in the first type trenches 101' and the gate runner polysilicon 105" in the second type trenches 101". Then as shown in the FIG. 3K, a plurality of openings 116' in a mask 116 are used for etching the insulation layer 109, the top electrode doping region 108, and the body region 107 to form a plurality of first through holes 110 that penetrate the insulation layer 109 and the top electrode doping region 108 and extend into the body region 107, and at least one second through hole 110' that penetrates the insulation layer 109 and contacts with the gate runner polysilicon 105" filled in the second type trenches 101". The depth of the first through holes 110, measured from the top surface of the top electrode doping region 108, is usually about 0.3 micron. As shown in the FIG. 3L, first conductivity type dopants are implanted in the body region 107 at the surrounding of the bottom part of the first through holes 110 to form a heavily doped contact region 110a. As shown in the FIG. 3M, a barrier material layer 112 (such as Ti/TiN) with excellent electrical conductivity is deposited, which covers the insulation layer 109, the respective bottom parts and sidewalls of the first through holes 110 and the second through holes 110'. Then conductive materials (such as W) 111 are filled in the first through holes 110 and the second through holes 110' with their bottom parts and sidewalls adhered with the barrier material layer 112. Furthermore, a metal layer 113 is deposited to cover the region of the barrier material layer 112 above the insulation layer 109 and the conductive materials 111 filled in the first through holes 110 and the second through holes 110', and is electrically contacted with the conductive materials 111. As shown in the FIG. 3N, etching is simultaneously implemented on the regions of the metal layer 113 and the barrier material layer 112 above the insulation layer 109, thus the metal layer 113 is divided into a second metal electrode 113A electrically connected with the conductive materials 111 filled in the first through holes 110 and a third metal electrode 113B electrically connected with the conductive materials 111 filled in the second through holes 110'. The remained parts 112'a and 112'b of the barrier material layer 112 covering above the insulation layer 109 after being etched are respectively maintained below the second metal electrode 113A and the third metal electrode 113B. As shown in the FIG. 3O, a bottom passivation layer 114b is deposited through PECVD covering on the bottom surface of the substrate 125 and a top passivation layer 114a may be deposited covering on the second metal electrode 113A and the third metal electrode 113B. The passivation layer usually is formed by silicon dioxide or silicon nitride. As shown in the FIG. 3P, one or more openings 114'b are formed in the bottom passivation layer 114b. Thus, the bottom passivation layer 114b is used as the mask and the opening 114'b on the bottom passivation layer 114b is used to implement etching on the substrate 125 to form one or more grooves 115 in the substrate 125 and the etching stops on the etching barrier layer 120. The etching of the substrate 125 can be wet etching or deep reaction dopant etching and the etchant used by wet etching can be tetramethylammonium hydroxide solution (TMAH) or potassium hydroxide solution (KOH) or ethylenediamine catechol solution (EDP). TMAH is compatible with the wet etching of CMOS and does not comprise alkali metal ions. However, EDP has negative factors such as corrosion and potential carcinogenicity. In addition, $K^+$ in the KOH etchant relates to a movable ionic charge source, which has negative influence on the electric characteristics of devices (such as threshold voltage). As such, TMAH is preferably used as the etchant in the invention.

Figure 3Q:
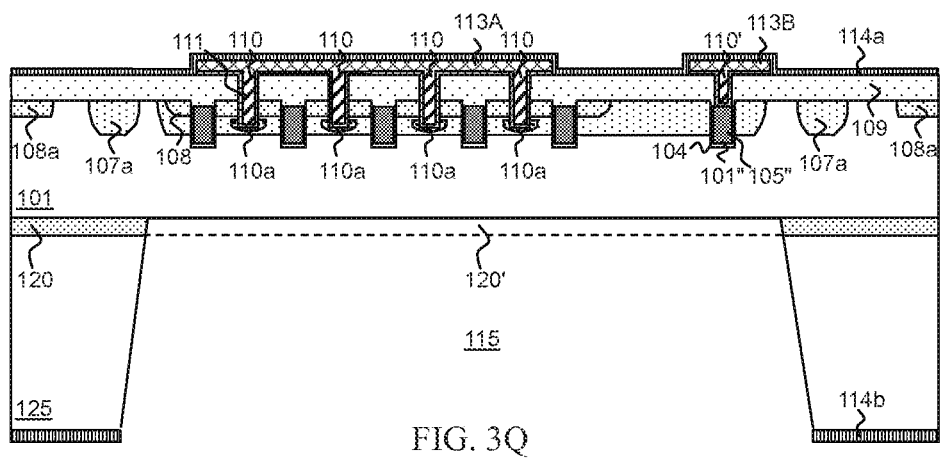
Figure 3R:
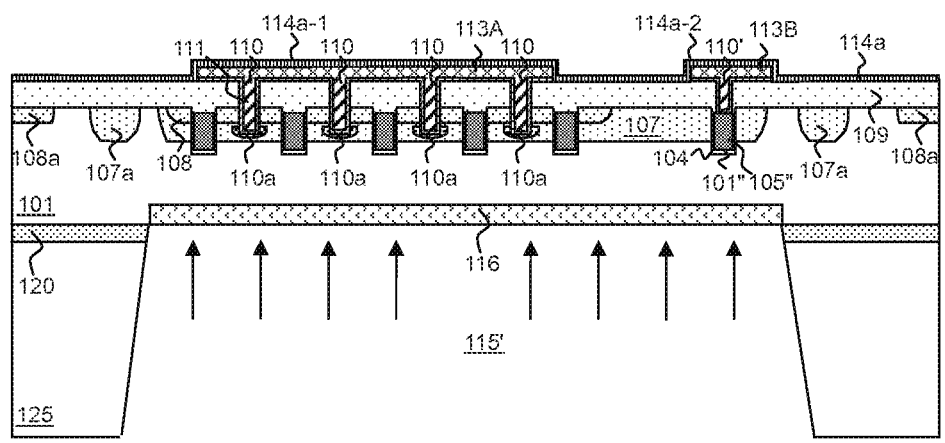
Figure 3S:
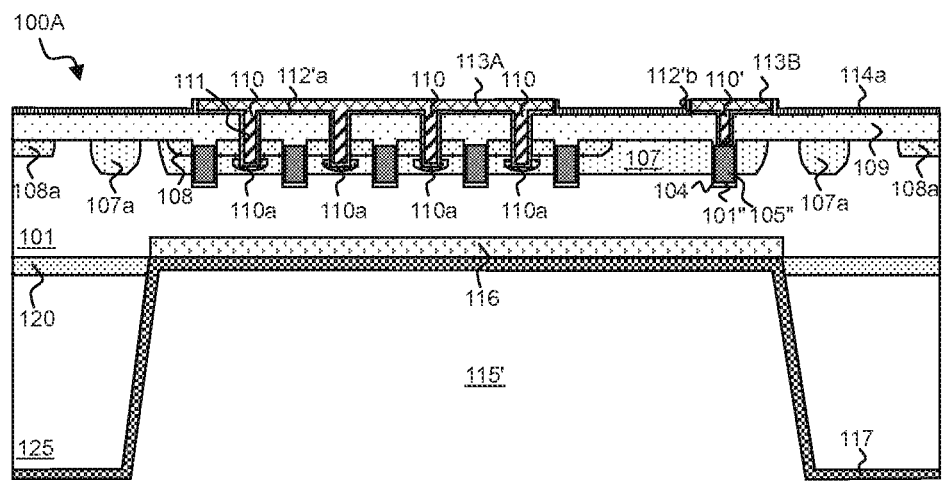
Figure 4A:
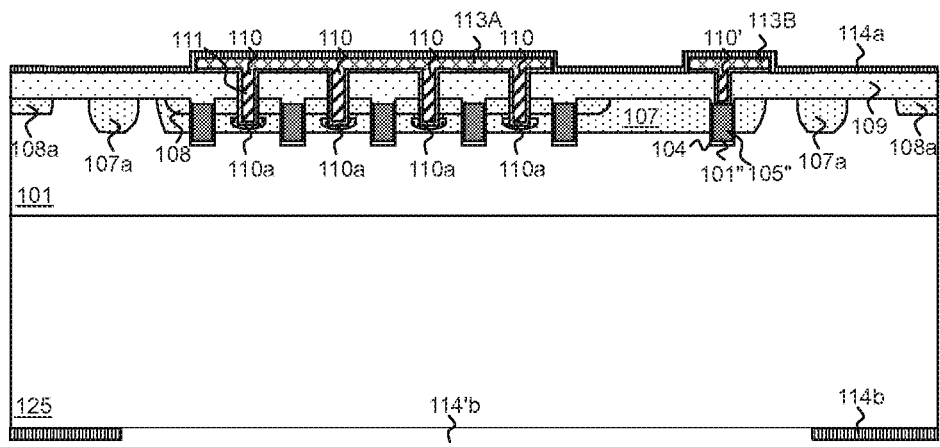
FIGS. 4A-4D are schematic diagrams of using PN junction between a substrate and an epitaxial layer as an etching barrier layer.
Figure 4B:
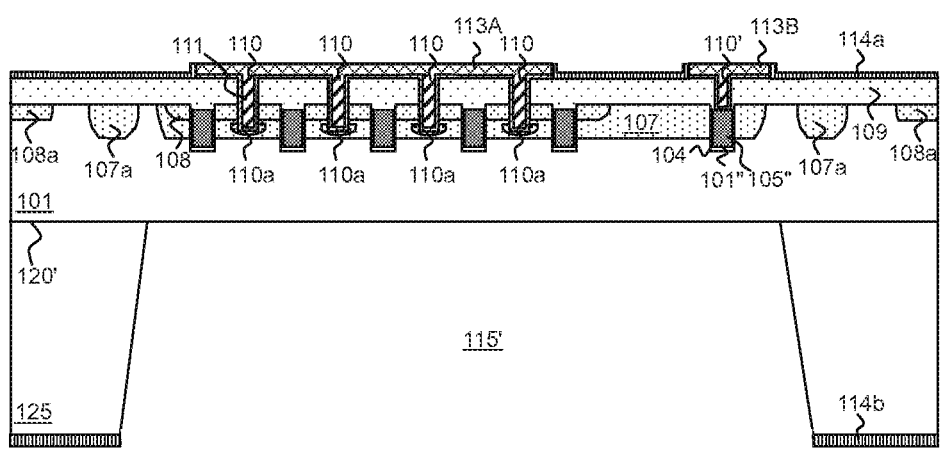
Figure 4C:
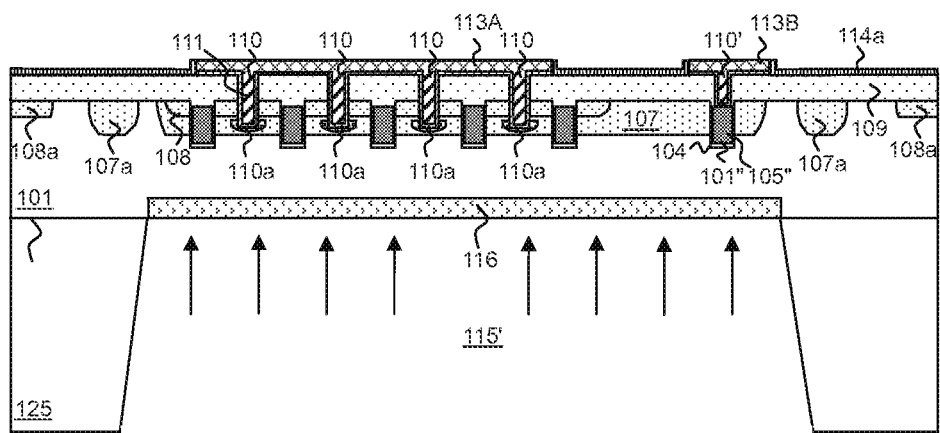
Figure 4D:
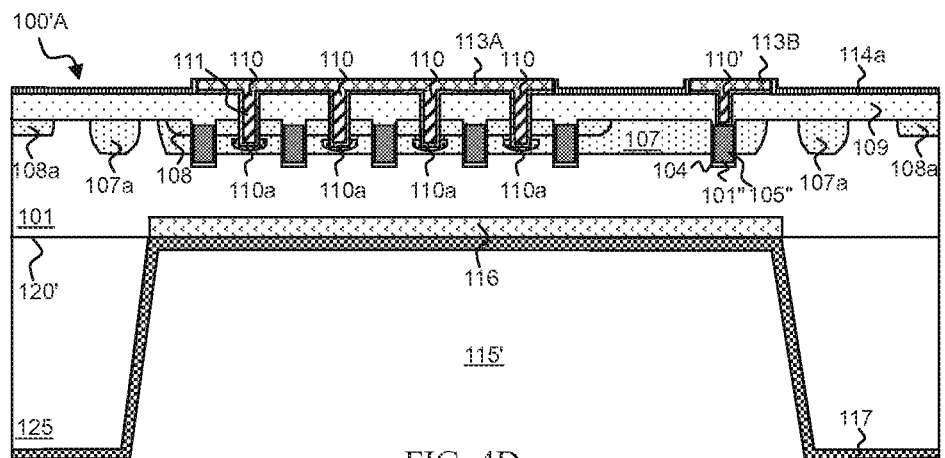

As shown in the FIG. 3Q, the region (such as region 120' framed by the dot line) exposed in the grooves 115 of the etching barrier layer 120 (usually formed by silicon dioxide) is further etched by a buffer hydrofluoric acid. Furthermore, the etching process stops at the epitaxial layer 101, thus forming one or more bottom grooves 115' that penetrate the substrate 125 and the etching barrier layer 120 in sequence. As shown in the FIG. 3R, dopants with the same conductivity type of the epitaxial layer 101 are implanted into the region of the epitaxial layer 101 exposed at the bottom grooves 115' to form a heavily doped bottom electrode contact region 116 that is arranged in the epitaxial layer 101 and above the top parts of the bottom grooves 115'. Then the bottom passivation layer 114b is removed and a part of top passivation layer 114a covering on the second metal electrode 113A and the third metal electrode 113B is removed. Specifically, the region (such as 114a-1) of the top passivation layer 114a covering on the second metal electrode 113A and the region (such as 114a-2) of the top passivation layer 114a covering on the third metal electrode 113B can be removed to expose the second metal electrode 113A and the third metal electrode 113B. As shown in the FIG. 3S, a metal layer (bottom metal layer) 117 is deposited to cover the bottom surface of the substrate 125 and the side walls and the top parts of the bottom grooves 115', such that the region of the metal layer 117 at the top parts of the bottom grooves 115' keeps excellent ohmic contact with the heavily doped bottom electrode contact region 116. As such, the metal layer 117 is used to form the first metal electrode of the power MOSFET device 100A. As shown in the FIG. 3S, the vertical power MOSFET unit is a trench type MOSFET in the MOSFET device 100A, in which, the gate polysilicon 105' filled in the first type trenches 101' forms the gate of the vertical MOSFET unit; a trench channel is formed in the body region 107; current controlled by the gate polysilicon 105' flows to the bottom surface (or opposite) of the epitaxial layer 101 from the top electrode doping region 108 through the body region 117; the bottom surface of epitaxial layer 101 forms the bottom electrode (such as drain) of the vertical MOSFET unit, while the corresponding top electrode doping region 108 usually forms the top electrode (such as source) of the vertical MOSFET unit; the conductive materials 111 filled in the first through hole 110 provide electrical contact between the top electrode doping region 108 and the second metal electrode 113A and also provide electrical contact between a source region and the body region; the second metal electrode 113A forms the source electrode of the MOSFET device 100A; the conductive materials 111 filled in the second through hole 110' provide electrical contact between the MOSFET device 100A and the gate runner polysilicon 105"; as the third metal electrode 113B is electrically conducted with any gate polysilicon 105', the third metal electrode 113B forms the gate electrode of the power MOSFET device 100A; and the first metal electrode formed by the metal layer 117 is the drain electrode of the power MOSFET device 100A. In this embodiment, the epitaxial layer is a lightly doped layer of the second conductive type, while the substrate can be of any conductive type, preferably lightly doped. For example, if the epitaxial layer 101 is a lightly doped N-epitaxial layer, then the first conductive type dopants can be P-type ions; the second conductive type dopants can be N-type ions; then the vertical MOSFET unit is an N-channel trench MOSFET; and the substrate 125 can be lightly doped N-substrate or lightly doped P-substrate. If the epitaxial layer 101 is a lightly doped P-epitaxial layer, then the first conductive type dopants can be N-type ions; the second conductive type dopants can be P-type ions; then the vertical MOSFET unit is a P-channel trench MOSFET; and the substrate 125 can be lightly doped N-substrate or lightly doped P-substrate.

Embodiment II

As shown in the FIG. 2B and the FIGS. 4A-4D, the epitaxial layer 101 is directly grown on the substrate 125 in a wafer 100'; both the substrate and the epitaxial layer are lightly doped. If the prepared vertical MOSFET unit is implemented in the wafer 100', then the procedures of preparing the vertical MOSFET unit in the epitaxial layer 101 are not different from that in the embodiment I; therefore, the same vertical MOSFET units are formed in the epitaxial layer 101 supported by the substrate 125. However, in this embodiment the doping conductivity types of the substrate 125 and the epitaxial layer 101 are opposite. The purpose is to use the PN junction at the interface of the substrate 125 and the epitaxial layer 101 as an etching barrier layer when the substrate 125 is etched. As shown in the FIG. 4A, the bottom passivation layer 114b is deposited on the bottom surface of the substrate 125. One or more openings 114b' (for the purpose of conciseness, only one opening is shown) are formed in the bottom passivation layer 114b. As shown in the FIG. 4B, with the PN junction formed at the interface of the substrate 125 and the epitaxial layer 101 under a reverse biased condition, an electric-chemical etching process may be carried out to etch the substrate 125 through the openings 114'b on the bottom passivation layer 114b. The wet etching etchant used in the electric-chemical etching method is usually tetramethylammonium hydroxide solution (TMAH) or potassium hydroxide solution (KOH). The etching reaction stops when the etching arrives at the PN junction, thus the etching stops at the epitaxial layer 101, thereby forming a plurality of bottom grooves 115' in the substrate 125 through the etching process. As shown in the FIG. 4C, dopants with same doping conductivity types of the epitaxial layer 101 are implanted into the region of the epitaxial layer 101 exposed at the bottom grooves 115'. The doping process is a heavily doped process to form a bottom electrode contact region 116 in the epitaxial layer 101. As shown in the FIG. 4D, a metal layer (bottom metal layer) 117 is deposited on the bottom surface of the substrate 125, which also covers on the sidewalls and the bottom surface of the bottom grooves 115', wherein the region of the metal layer 117 at the bottom surface of the bottom grooves 115' keeps excellent ohmic contact with the bottom electrode contact region 116. Furthermore, the first metal electrode formed by the metal layer 117 is the drain electrode of the power MOSFET device 100'A; the second metal electrode 113A forms the source electrode of the power MOSFET device 100'A; and the third metal electrode 113B forms the gate electrode of the power MOSFET device 100'A.

Embodiment III

Figure 5A:
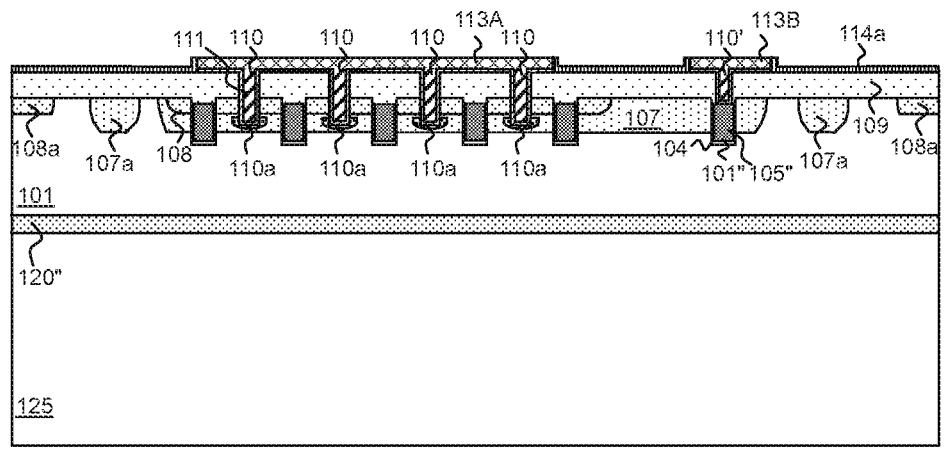
FIGS. 5A-5D are schematic diagrams of using heavily doped buried layer between a substrate and an epitaxial layer as an etching barrier layer.
Figure 5B:
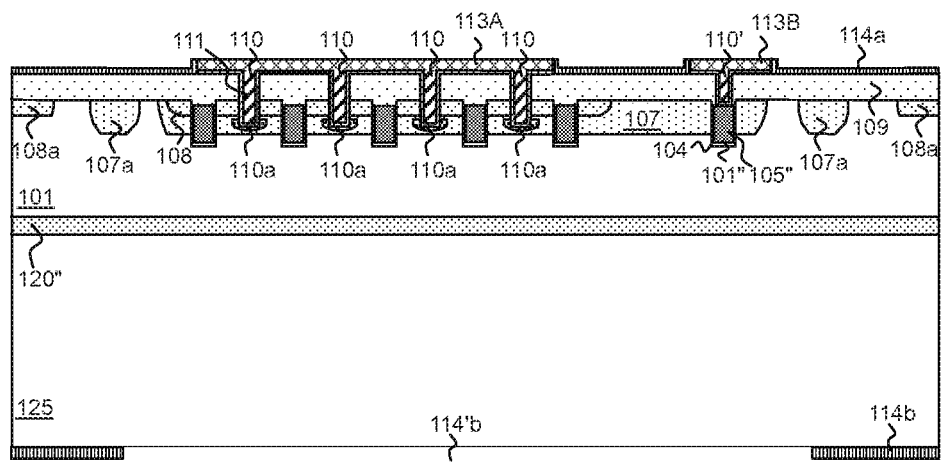
Figure 5C:
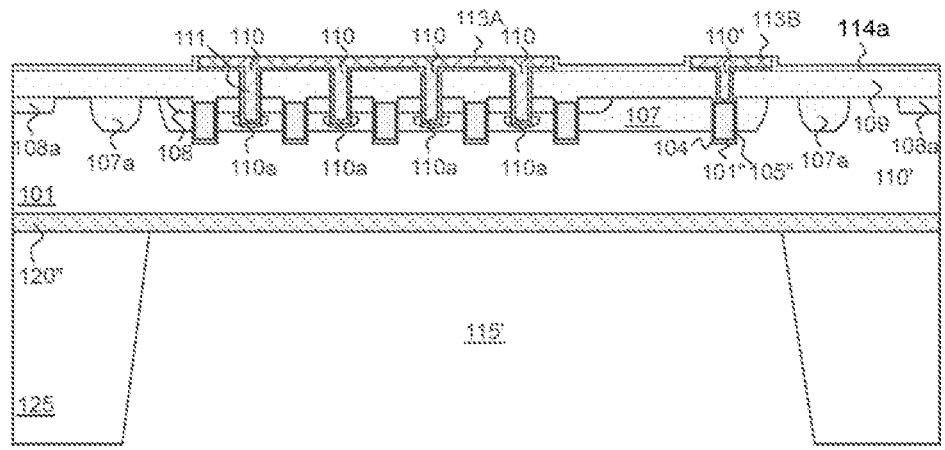
Figure 5D:
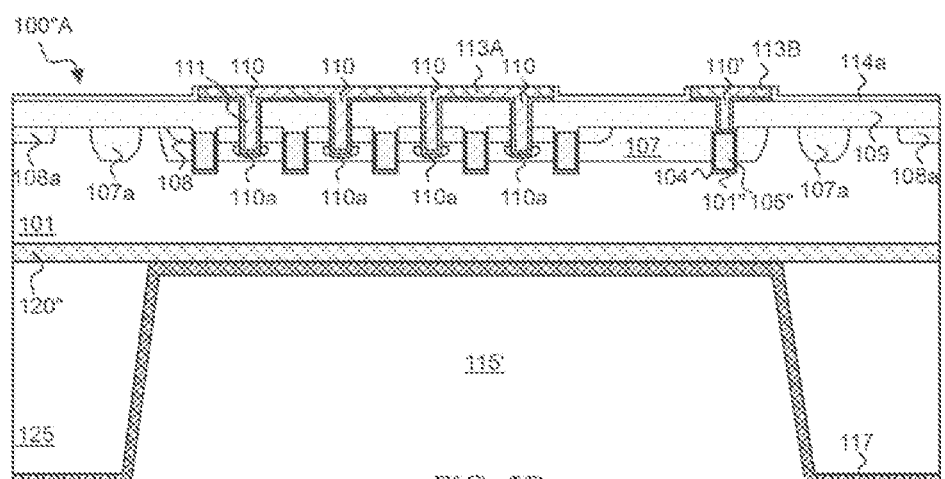

As shown in the FIG. 2C, the FIG. 2D and the FIGS. 5A-5D, a heavily doped layer is formed at the top surface of the substrate 125 to form a buried heavily doped layer 120" previously the growing of the epitaxial layer 101 on the substrate 125 of wafer 100", thus the buried heavily doped layer 120" is sandwiched between the epitaxial layer 101 and the substrate 125. If the vertical MOSFET unit prepared previously is implemented in the wafer 100", then the procedures of preparing the vertical MOSFET unit in the epitaxial layer 101 as disclosed in the FIG. 5A are not different from that in the Embodiment I. In this embodiment, the buried heavily doped layer 120" is mainly used as an etching barrier layer for etching the substrate 125. One preferable mode is as follows: the P+ buried heavily doped layer 120" is implanted from the top surface of the lightly doped P− substrate 125, for example, with the doping concentration of boron exceeding 1e19/cm³. Then the P− epitaxial layer 101 is grown on the substrate 125. Since the doping conductivity types of the epitaxial layer 101, the heavily doped layer 120" and the substrate 125 are the same, then a current controlled by the gate polysilicon 105' can flow to the bottom surface of the epitaxial layer 101 from the top electrode doping region 108 through the body region 107 and continuously flow to the bottom surface (or opposite) of the substrate; therefore, the bottom surface of the substrate 125 forms the bottom electrode (drain) of the vertical MOSFET unit. As shown in the FIG. 5B, the bottom passivation layer 114b is deposited covering on the bottom surface of the substrate 125, and one or more openings 114'b are formed in the bottom passivation layer 114b. The openings 114'b on the bottom passivation layer 114b is used for the etching on the substrate 125. The etching stops on the etching barrier layer formed by the buried and heavily doped layer 120", thus, one or more bottom grooves 115' in the substrate 125 are formed through the etching process as shown in the FIG. 5C. Furthermore, as shown in the FIG. 5D, a metal layer (bottom metal layer) 117 is deposited covering on the bottom surface of the substrate 125 and also covering the sidewalls and the bottom surface of the bottom grooves 115', in which the region of the metal layer 117 at the top parts of the bottom grooves 115' keeps an excellent ohmic contact with the buried heavily doped layer 120". Therefore, the first metal electrode formed by the metal layer 117 is the drain electrode of a power MOSFET device 100"A; the second metal electrode 113A forms the source electrode of the power MOSFET device 100"A; and the third metal electrode 113B forms the gate electrode of the power MOSFET device 100"A. The first conductive type dopants can be P-type ions; the second conductive type dopants can be N-type ions; then the vertical MOSFET unit is a P-channel trench MOSFET. In this embodiment, the epitaxial layer is of a lightly doped second conductive type while the substrate can be of any conductive type, preferably lightly doped. The heavily doped layer is preferable P type regardless the conductive type the substrate.

Embodiment IV

Figure 6:
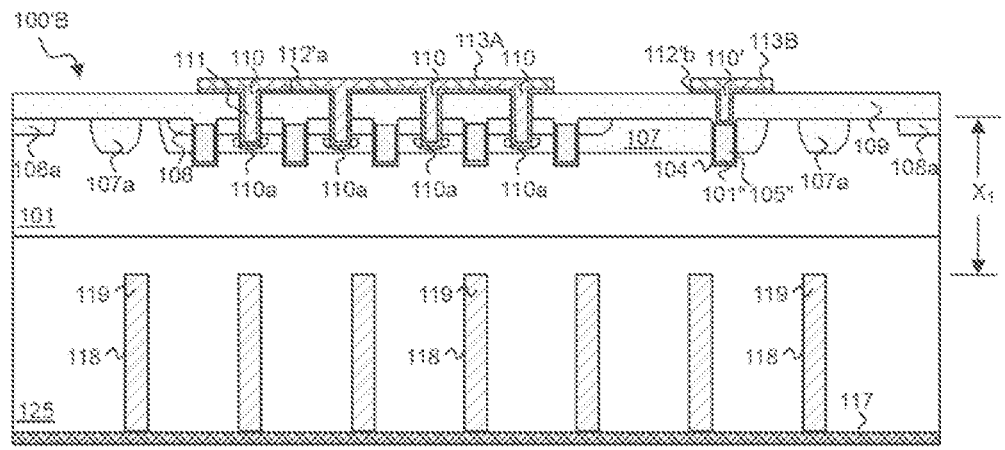
FIG. 6 is a schematic diagram of directly forming bottom through holes in a substrate and filling metal materials in the bottom through holes.

As shown in the FIG. 2B and the FIG. 6, the epitaxial layer 101 is directly grown on the substrate 125 in the wafer 100'. If the vertical MOSFET unit prepared previously is implemented in the wafer 100', then the procedures of preparing the vertical MOSFET unit in the epitaxial layer 101 are not different from that in Embodiment I; therefore, the same vertical MOSFET units are formed in the epitaxial layer 101 supported by the substrate 125. In this embodiment, the doping conductivity types of the substrate 125 and the epitaxial layer 101 are the same. However, the substrate 125 can be heavily doped, while the epitaxial layer 101 can be lightly doped. As the doping types of the epitaxial layer 101 and the substrate 125 are the same, then current controlled by the gate polysilicon 105' can flow to the bottom surface of the epitaxial layer 101 from the top electrode doping region 108 through the body region 107 and continuously flow to the bottom surface (or opposite) of the substrate; therefore, the bottom surface of the substrate 125 is considered to the bottom electrode (drain) of the vertical MOSFET. A bottom passivation layer (not shown) may be deposited covering on the bottom surface of the substrate 125. One or more openings are formed in the bottom passivation layer, which are used for the etching on the substrate 125 and the etching stops in the substrate 125. One or more bottom through holes 118 in the substrate 125 are formed through etching process such as dry etching or laser blazing, and a predetermined distance $X_1$ from the bottom of the through holes 118 to the top surface of epitaxial layer 101 can be maintained by controlling the time or other etching factors during the process of etching the substrate so as to keep a distance $X_1$ in a range between 5 microns and 20 microns. After a barrier material layer such as a Ti/TiN layer (not shown) is deposited on the sidewalls and the bottom surface of the bottom through holes 118, chemical vapor deposition is implemented to deposit a conductive material such as W 119 in the bottom through holes 118, thereby filing the bottom through holes 118. Then, a metal layer (bottom metal layer) 117 is deposited covering on the bottom surface of the substrate 125, which is also electrically contacted with the conductive material 119 filling in the bottom through holes 118. In an alternative embodiment, the metal layer 117 is directly deposited on the barrier material layer and fills the through holes 118, thus the step of chemical vapor deposition of the conductive material 119 into the through holes 118 is omitted. Thus, the first metal electrode formed by the metal layer 117 is a drain electrode of the power MOSFET device 100'B; the second metal electrode 113A forms the source electrode of the power MOSFET device 100'B; and the third metal electrode 113B forms the gate electrode of the power MOSFET device 100'B. Alternatively, if the substrate 125 is a lightly doped substrate, second conductive type dopants can be implanted into the side walls and the bottom of the bottom through holes 118 after the bottom through holes are etched, and then the barrier material layer is deposited.

Figure 7:
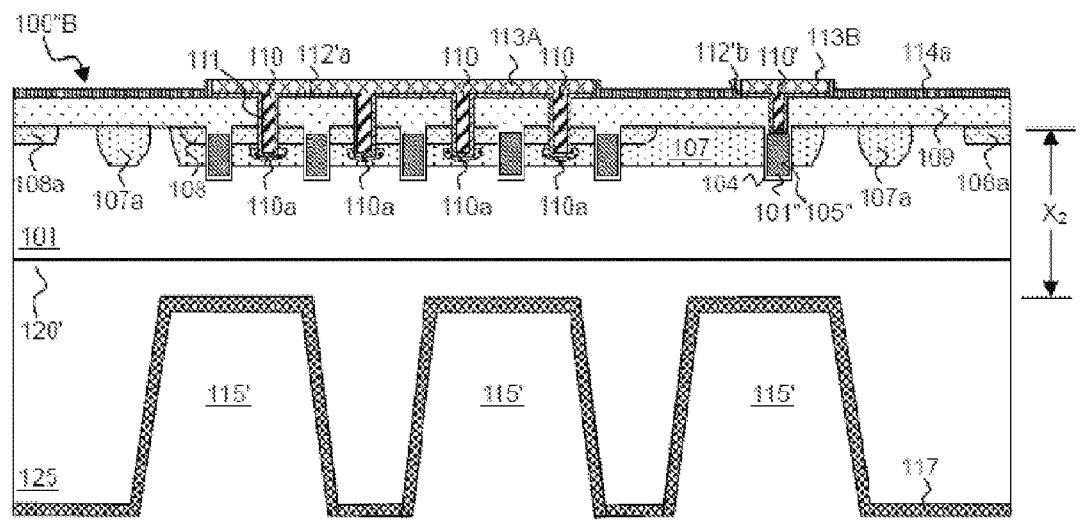
FIG. 7 is a structural schematic diagram of directly forming a plurality of bottom grooves in a substrate without using any etching barrier layer.

As shown in the FIG. 2B and the FIG. 7, the epitaxial layer 101 is directly grown on the substrate 125 in a wafer 100'. If the vertical MOSFET unit prepared previously is implemented in the wafer 100', then the procedures of preparing the vertical MOSFET unit in the epitaxial layer 101 are not different from that in Embodiment I; therefore, the same vertical MOSFET units are formed in the epitaxial layer 101 supported by the substrate 125. In this embodiment, the doping conductivity types of the substrate 125 and the epitaxial layer 101 may be the same. In this device, a plurality of narrower bottom grooves are formed in the substrate through the etching process with the etching stops in the substrate, not at the epitaxial layer, and a predetermined distance $X_2$ from the bottom of the groves 115' to the top surface of epitaxial layer 101 can be maintained by controlling the time or other etching factors during the process of etching the substrate so as to keep a distance $X_2$ in a range between 10 microns and 20 microns. A metal layer (bottom metal layer) 117 is deposited on the bottom surface of the substrate 125, which also covers on the sidewalls and the bottom surface of the bottom grooves 115'.

Figure 8:
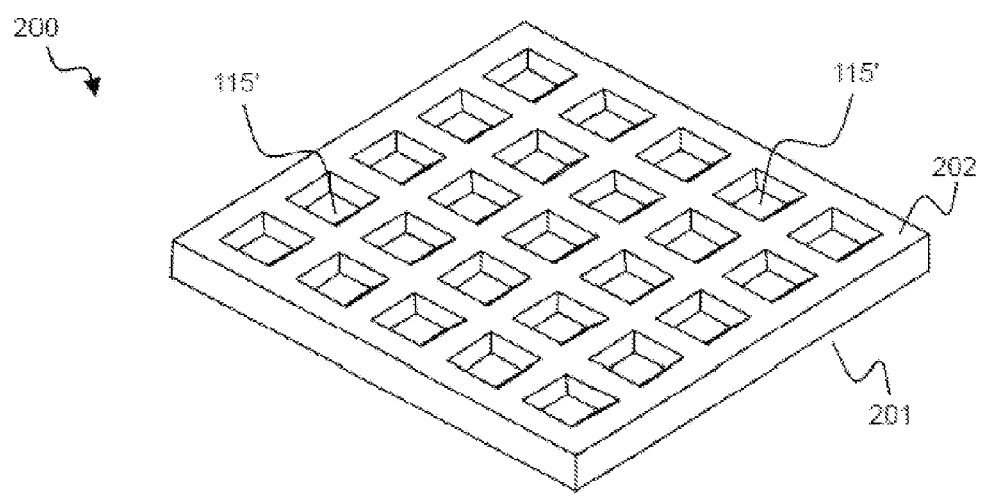
FIG. 8 is a structural schematic diagram of forming a plurality of bottom grooves in a substrate of a leadframe/base.
Figure 9:
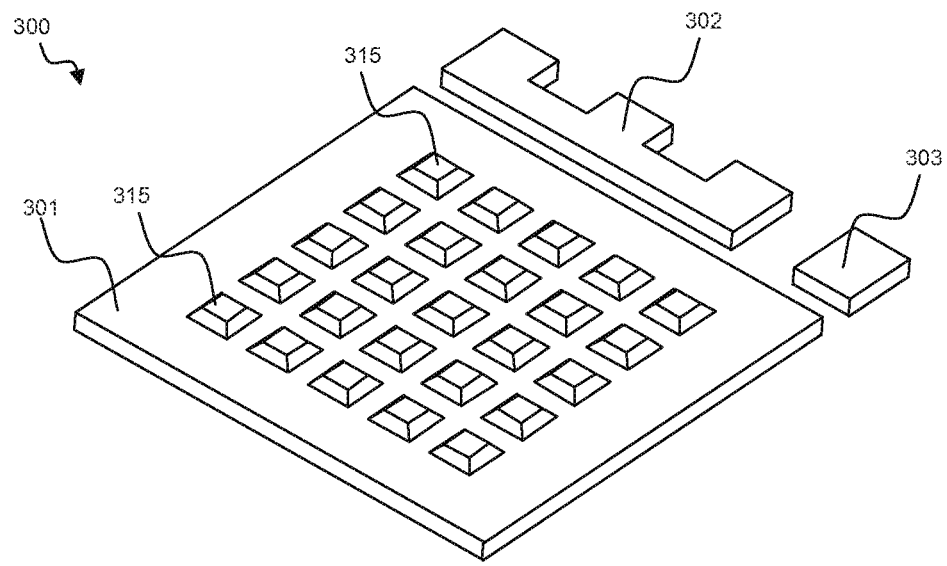
FIG. 9 is a structural schematic diagram of a leadframe/base with metal lugs matching with the bottom grooves in the substrate.
Figure 10:
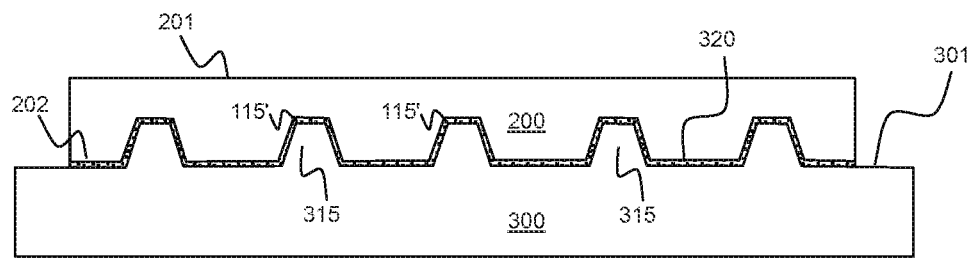
FIG. 10 is a sectional schematic diagram of attaching the power MOSFET on a base provided with the metal lugs.
Figure 11:
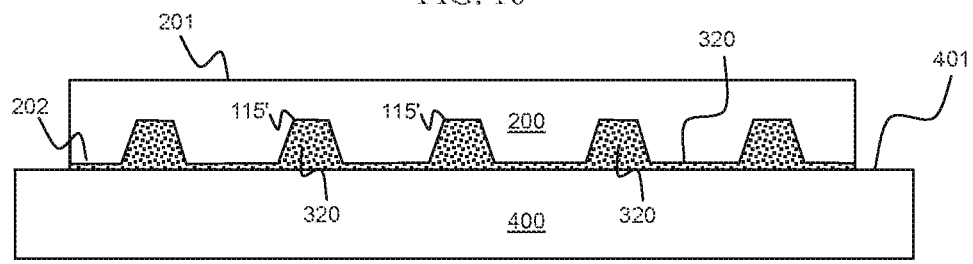
FIG. 11 is a sectional schematic diagram of attaching the power MOSFET on a base without metal lugs.

In a power MOSFET device 200 as shown in the FIG. 8, a plurality of bottom grooves 115' are formed in the substrate 125, which can form a matrix, and are arranged at the bottom surface 202 of the power MOSFET device 200. Note that the metal layer 117 is not shown in the FIG. 8. However, the first metal electrode formed by the metal layer 117 is the drain electrode of the power MOSFET device 200; the second metal electrode forms the source electrode of the power MOSFET device 200; the third metal electrode forms the gate electrode of the power MOSFET device 200 with both the second metal electrode and the third metal electrode arranged at one side of the top surface 201 of the power MOSFET device 200. In order to reduce the Rdson of the MOSFET device, a base 300 that includes a plurality of metal lugs 315 protruding out of a top surface 301 as shown in the FIG. 9 can be provided. Preferably the metal lugs 315 are formed of same material as the lead frame, or even formed with the lead frame at the same time from a single gauge material. The number of the metal lugs 315 on the base 300 corresponds to the number of the bottom grooves 115' on the MOSFET device 200, and the profile of the metal lugs 315 are in conformal to the structure of the bottom grooves 115'. For example: the metal lugs 315 may be four-edge prismatic mesas if the structure of the bottom grooves 115' are four-edge prismatic cavities. Furthermore, the sizes of the bottom grooves 115' are preferably slightly larger than the metal lugs 315 in order for the metal lugs to fit into the bottom grooves 115'. Other shapes such as cube, cuboid, cylinder, etc., may be selected. A conductive adhesive material 320 (such as conductive silver paste or soldering paste) is used to connect the power MOSFET device 200 on the top surface 301 of the base 300, in which each metal lug 315 is embedded into one correspondingly bottom groove 115'. The conductive adhesive material 320 is applied between the metal layer 117 and the base 300, thus the conductive adhesive material 320 fills any space between the bottom groove 115' and the metal lugs 315. FIG. 10 is the cross-sectional schematic diagram of the power MOSFET device 200 and the base 300 stuck together. In the FIG. 9, a source lead 302 arranged near the base 300 can be electrically connected with the second metal electrode through metal connectors, thus serving as the source pins of the power MOSFET device 200. A gate lead 303 arranged near the base 300 can be electrically connected with the third metal electrode through metal connectors, thus serving as the gate pins of the power MOSFET device 200, while the broader base 300 can directly serves as the drain pins and heat sink of the power MOSFET device 200. The power MOSFET device 200 can be stacked on the top surface 301 of the base 300 in a vacuum environment in order to avoid air pockets thus improve the adhesion between the power MOSFET device 200 and the base 300, and prevent the power MOSFET device 200 from separating from the base 300. In another embodiment as shown in the FIG. 11, the power MOSFET device 200 can even be directly attached on the top flat surface 401 of a base 400 and directly filled in the bottom grooves 115' and the sticking process can also be implemented in a vacuum environment in order to avoid air pockets in the bottom grooves 115'. Alternatively, as shown in the Embodiment IV, the bottom grooves 115' may be filled with a conductive material (such as W) different from the lead frame material so that the power MOSFET device 200 can have a flat bottom surface stuck on the flat top surface 401 of the base 400. Both the base 300 and the base 400 can provide good package.

Figure 12:
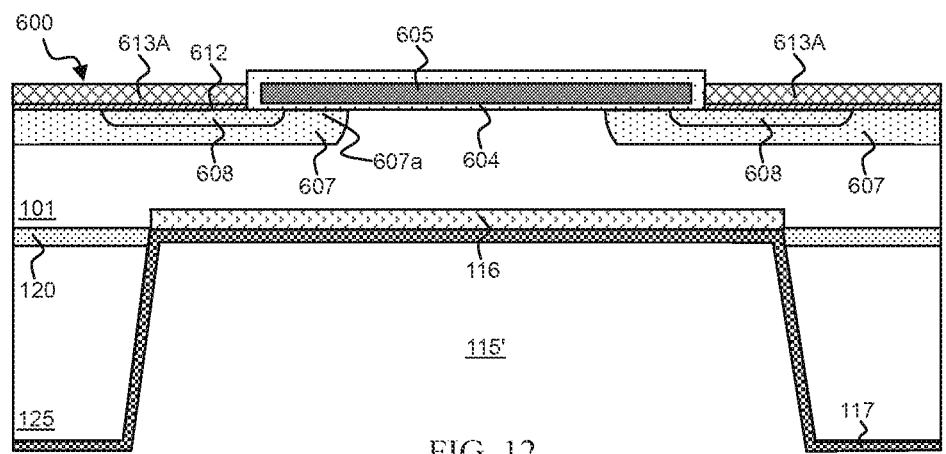
FIG. 12 is a structural schematic diagram of forming the bottom grooves in the substrate of VDMOS.

The contents above are all described and explained by taking the trench gate vertical MOSFET devices as example. Actually, the embodiments are also suitable for planar gate vertical MOSFET devices such as vertical double-diffusion MOSFET (VDMOS) devices. As shown in the FIG. 12, the vertical MOSFET unit is formed in the epitaxial layer 101 supported by the substrate 125. In this embodiment, the gate of the vertical MOSFET unit is planar type, rather than trench type. Particularly, the body region 607 of the VDMOS is formed in the epitaxial layer 101 and near the top surface of the epitaxial layer 101. A top electrode doping region (namely source region) 608 is formed in the body region 607 extending from the top surface of the body region 607 into the body region 607. A gate oxide layer 604 is arranged below a polysilicon gate 605; the region 607a of the body region 607 is arranged below the gate oxide layer 604 and the polysilicon gate 605; moreover, the region 607a is arranged between the top electrode doping region 608 and the epitaxial layer 101; therefore, the region 607a forms a current channel of the VDMOS device vertically flowing from the top electrode doping region 608 through the body region 607a and to the bottom surface of the epitaxial layer 101; therefore, the bottom surface of the epitaxial layer 101 forms the bottom electrode (drain) of the vertical MOSFET unit. A barrier material layer 612 and a metal layer 613A provide short circuit between the top electrode doping region 608 and the body region 607. The etching barrier layer 120 is arranged between the epitaxial layer 101 and the substrate 125, which contains one or more bottom grooves 115' penetrating the substrate 125 and the etching barrier layer 120 in sequence. Dopants with the same doping types of the epitaxial layer 101 are injected into the area of the epitaxial layer 101 exposed through the bottom grooves 115' to form the heavily doped bottom electrode contact region 116 above the bottom grooves 115' in the epitaxial layer 101. The metal layer (bottom metal layer) 117 is deposited on the bottom surface of the substrate 125 covering on the sidewalls and the bottom surface of the bottom grooves 115', in which, the metal layer 117 at the bottom surface of the bottom grooves 115' keeps contact with the bottom electrode contact region 116. Thus, the metal layer 117 is used to form the first metal electrode (drain) of the VDMOS device; then the metal layer 613A is the second metal electrode (source); while a metal layer (not shown) connected with the polysilicon gate 605 forms the third metal electrode (gate). As the contents disclosed previously sufficiently disclose the adjustments on the method for preparing the bottom grooves to cope with different wafers (namely cope with different etching barrier layers), the method for preparing the bottom grooves for the planar gate VDMOS is not repeated here.

Typical embodiments for the specific structures are given out through explanations and drawings; for example, the scheme describes with a vertical MOSFET with a top source electrode and a bottom drain electrode. Based on the spirit of the invention, other types of semiconductor chips are applicable; for example, the vertical MOSFET may be replaced with a vertical MOSFET having a top drain electrode and a bottom source electrode. Although the invention discloses the specific preferable embodiments, the scopes of invention are not limited to these specifics.

Various changes and modifications are undoubtedly obvious for the technical personnel of the field after reading the specification. Therefore, the attached claims should be considered as the concept and scope of the invention covering all the variations, modifications and equivalents.

The invention claimed is:

1. A method for making a low-Rdson vertical power MOSFET device in an epitaxial layer of a first conductivity type supported on a substrate with a bottom of the epitaxial layer configured as a bottom electrode of the vertical power MOSFET device comprises the following steps:

forming a lightly doped epitaxial layer on a lightly doped substrate;

forming a vertical MOSFET device in the epitaxial layer;

depositing a bottom passivation layer covering a bottom surface of the substrate;

forming a plurality of openings in the bottom passivation layer;

etching the substrate through the openings on the bottom passivation layer forming a plurality of grooves penetrating the substrate exposing portions of a bottom surface of the epitaxial layer;

depositing a metal layer covering the bottom surface of the substrate, sidewalls of the grooves and the exposed portions of the bottom surface of the epitaxial layer wherein the metal layer forming a bottom metal electrode of the vertical power MOSFET, wherein the substrate being doped with a second conductivity type opposite to the first conductivity type of the epitaxial layer thus forming a PN junction at an interface of the substrate and the epitaxial layer therefore providing an etch stop when reversed bias to stop an electric-chemical etching process after etching the grooves through the substrate, and wherein the method further comprising implanting dopant of the first conductivity type from the bottom of the substrate forming a plurality of heavily doped regions at the exposed portions of the bottom of the epitaxial layer corresponding to the grooves.

2. The method according to claim 1 wherein the substrate being doped with the first conductivity type; wherein an etching barrier layer being disposed between the substrate and the epitaxial layer, the etching barrier layer stopping a first etching process after using the openings on the bottom passivation layer to etch the grooves through the substrate, wherein the method further comprising a second etch etching through the barrier layer exposing portions of the epitaxial layer and implanting dopant of the first conductivity type from the bottom of the substrate forming a plurality of heavily doped regions at the exposed portions of the bottom of the epitaxial layer corresponding to the groove.

3. The method according to claim 1 wherein an etching barrier layer formed by a buried heavily doped layer being disposed between the substrate and the epitaxial layer.

4. The method according to claim 3 wherein the epitaxial layer being a lightly doped P type epitaxial layer and the vertical MOSFET being a P-channel trench MOSFET.

5. The method according to claim 3 wherein the buried heavily doped layer being a P− type heavily doped layer having a doping concentration of more than 1e19/cm3.

* * * * *